United States Patent [19]

Turnbull

[11] Patent Number: 4,469,943
[45] Date of Patent: Sep. 4, 1984

[54] PYROELECTRIC DETECTOR

[75] Inventor: Andrew A. Turnbull, Reigate, England

[73] Assignee: U.S. Philips Corporation, New York, N.Y.

[21] Appl. No.: 383,852

[22] Filed: Jun. 1, 1982

[30] Foreign Application Priority Data

Jun. 5, 1981 [GB] United Kingdom ............... 8117310

[51] Int. Cl.³ .................................... G01J 5/00
[52] U.S. Cl. .................................... 250/338
[58] Field of Search ............... 250/338, 342, 349; 374/121, 163, 165

[56] References Cited

U.S. PATENT DOCUMENTS 2,740,031 3/1956 Addink ................................ 338/28
3,813,550 5/1974 Abrams et al. ..................... 250/338
4,425,502 1/1984 Hall et al. ..................... 250/338 PY
4,425,504 1/1984 Turnbull et al. ................. 250/353

Primary Examiner—Janice A. Howell
Assistant Examiner—Constantine Hannaher
Attorney, Agent, or Firm—Robert T. Mayer; Bernard Franzblau

[57] ABSTRACT

A pyroelectric detector comprises an element (1) of pyroelectric material that responds to variations with time in the intensity of radiation incident on an operative surface region of the detector much larger than the area of a major face of the element (1). The Noise Equivalent Power of the detector is improved by providing a thermal diffusion means (10) to conduct thermal energy to the element from remote parts of the region. The element is resiliently supported on one or more flexible films (2,3) and the thermal diffusion means (10) is a thermally conductive layer on a film (3).

17 Claims, 1 Drawing Figure

U.S. Patent  Sep. 4, 1984  4,469,943
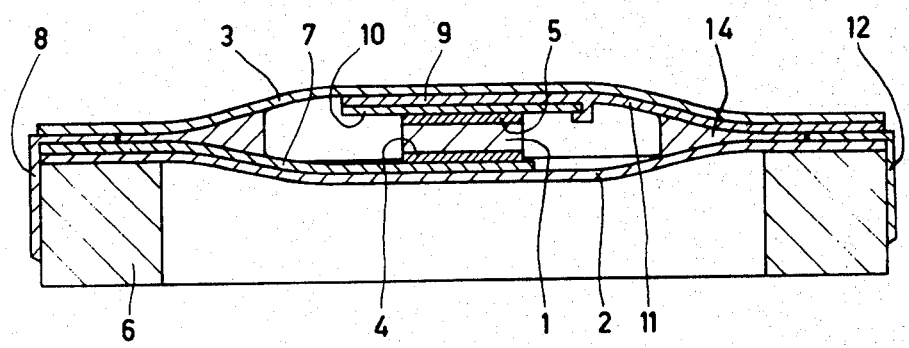

PYROELECTRIC DETECTOR

This invention relates to a pyroelectric detector comprising an element of pyroelectric material having at least one pair of opposed faces for generating electrical charges at the two faces of said one pair when the temperature of the element changes, and electrode means extending over at least one of the faces of said one pair for detecting charges generated by the element, the detector having an operative surface region, variations with time in the intensity of radiation incident on every part of which region cause variations in the generated charges detectable with the electrode means. The invention further relates to a method of operating such a detector.

When the temperature of an element of pyroelectric material changes, there is a change in the spontaneous polarization of the material along a predetermined axis and hence charges are produced on opposed faces of the element spaced along said axis. This phenomenon is utilised in a pyroelectric radiation detector by using thermal energy from radiation incident on the detector to change the temperature of the element. Since the element generates charges only while its temperature is changing and since such charges would tend to leak away or be neutralised, the detector is suited to detect a change in the incident radiation. This may be a sudden change due to an external cause not related to the detector, or the detector may be associated with means for varying the intensity of the radiation incident on the detector such as a chopper which periodically interrupts a beam of radiation from an external source and provides radiation at a substantially constant reference temperature, enabling a continuous electrical signal to be derived from the detector if there is a difference between the temperature of the beam and the reference temperature. The frequency with which the intensity is varied may for example be in the range of a few Hertz to several hundred Hertz.

The temperature change of the element may be detected by, for example, detecting a current that flows between two electrodes respectively on the two faces of said one pair while the temperature of the element is changing or by detecting accumulated surface charge (before it is neutralised by stray charges or leaks away) by detecting a current that flows to an electrode on one of said two faces when the potential of the other of the two faces is restored to a predetermined value with an electron beam, as occurs where the element is used in a pyroelectric camera tube.

A pyroelectric detector as set forth in the opening paragraph is described in U.K. Patent Specification No. 1,440,674. This detector comprises a slice of pyroelectric material having electrodes extending over each of two opposed major surfaces. The slice is attached via one electrode, which extends over the whole of the front surface of the slice, to a conducting mount having a central aperture. The other electrode extends over only a part of the rear surface of the slice, being concentric with the aperture in the mount. The detector is operable to detect variations in the intensity of radiation incident only on the surface region of the detector defined by the aperture in the mount, i.e. variations in the intensity of radiation incident on the detector other than in this region will cause no substantial generation of charge detectable with the electrodes. This is due to the relatively large thermal capacity of the mount: the time taken for any variation in the thermal energy of radiation incident on it to diffuse through it to the element is long compared with a desirable response time of the detector, either for a single step change in the radiation incident from an external source or for variations imposed by a chopper associated with the detector, and furthermore the magnitude of the variation in temperature at the element will tend to be very much less than that at the surface of the mount on which the radiation is incident. Moreover, variations in the intensity of radiation incident on the operative surface region cause variations in the temperature not only of the portion of pyroelectric material that generates charges detectable with the electrodes but also of the surrounding pyroelectric material and of the adjacent portion of the mount into which thermal energy tends to diffuse. Consequently, the proportion of a variation in thermal energy from incident radiation that contributes to the generation of charges detectable with the electrodes is reduced.

In other known pyroelectric detectors, for example those in which the element is mounted on a thin plastic film, the operative surface region of the detector may be substantially the whole of a major surface of the element of pyroelectric material. However, the thermal conductance from the operative surface region may also be low.

It is an object of the invention to provide an improved pyroelectric detector.

According to a first aspect of the invention, a pyroelectric detector as set forth in the opening paragraph is characterised in that the volume of the element of pyroelectric material is substantially less than would be the volume of an element of pyroelectric material which extended over the whole of the region and which had a thickness equal to the smallest spacing between the faces of said at least one pair, and in that the detector comprises thermal diffusion means extending to the element from parts of said region remote therefrom for supplying thermal energy to the element from radiation incident on said remote parts.

An important characteristic of a pyroelectric detector is its Noise Equivalent Power (NEP), which may be defined as the Root Mean Square power of sinusoidally varying radiation incident on the detector for which the signal-to-noise ratio of the detector in a bandwidth of one Hertz is unity. NEP depends on the responsivity of the detector, which may for example be expressed in terms of the signal current produced by the detector per unit power of sinusoidally varying incident radiation, and on several sources of electrical noise, which may for example be expressed as noise currents. In practice, a pyroelectric detector must be used with an amplifier since the signal generated by the detector is small, and the sources of noise are variously associated with the detector itself or with the amplifier, or with both.

Comparing a detector embodying the invention with a detector of known type, we may consider two cases: if the pyroelectric element is taken to be of a predetermined size, the detector embodying the invention responds to variations in radiation incident on a substantially larger operative surface region, while if the operative surface region is taken to be of a predetermined size, the detector embodying the invention uses a substantially smaller pyroelectric element. The former case is relevant to operating conditions in which an increase in operative surface region increases the quantity of varying radiation incident on the detector: the NEP is thus reduced (i.e. improved) since the signal current is increased. The latter case is relevant to a detector which must be responsive to a variation in incident radiation anywhere in a given area, for example where an optical system associated with the detector focuses incoming radiation from a particular external source to a spot on the detector, the position of the spot depending on the angle between the incoming radiation from the source and an optical axis of the system; the size of the operative surface region of the detector is determined by the desired field of view within which the external source must be detectable. For such a situation, a theoretical analysis by the applicants of a detector with electrodes extending across both of the faces of the pyroelectric element at which charges are generated has indicated that NEP will be reduced if the pyroelectric material which is between the electrodes can be reduced in size without reducing the operative surface region of the detector. Factors relevant to this analysis are considered in, for example, the paper "Pyroelectric Detectors and Materials" by S. T. Liu et al, Proc. IEEE, Vol 66, No. 1 (January 1978), pp 14–26. As indicated in that paper, electrodes of a detector comprising a cuboidal element of pyroelectric material may be on major surfaces of the element (so-called "face electrodes") or on minor surfaces perpendicular thereto (so-called "edge electrodes"). In both cases, radiation is assumed to be incident on a major surface. The "face electrode" configuration is the more common, and only that configuration is considered in detail in the paper. Consideration by the applicants of various sources of noise in a detector of each configuration when used with an amplifier and of the dependence of the noise currents on the area of the electrodes and the spacing of the electrodes has shown that NEP is proportional to the square root of the sum of several terms, comprising a term proportional to the square of the area, a term proportional to the square of the spacing, and a term proportional to the product of the area and the spacing, i.e. the volume of operative pyroelectric material. This last term represents noise due to the dielectric loss (tan δ) of the pyroelectric material, which in practice may be the most significant cause of noise. It is clear that if the volume of operative pyroelectric material is reduced, at least two of these three terms will decrease, and hence the NEP will decrease. Considered in a different way, a reduction in the area of a major surface of the element will in the case of face electrodes reduce the area of the electrodes and will in the case of edge electrodes reduce the spacing of the electrodes if the area of the major surface is reduced by reducing a dimension thereof perpendicular to the planes of the electrodes or reduce the area of the electrodes if the area of the major surface is reduced by reducing a dimension thereof parallel to the planes of the electrodes, or reduce both the spacing and the area of the electrodes if both dimensions are reduced. In all cases, the thickness of the element normal to the major surfaces, i.e. the smallest spacing between opposed surfaces of the element, is assumed to be constant, and a detector embodying the invention may thus be compared with a hypothetical detector of known type in which this thickness is the same but the area of the major surface is increased so that the element extends over the whole operative surface region.

As indicated above, the two faces of said one pair may be major surfaces of the element between which is said smallest spacing. In the case of a target for a pyroelectric camera tube where the generated charge is detected using a scanning electron beam, it is desirable for the time constant of beam resistance multiplied by target capacitance to be much less than the frame scan period in order for the charge to be read out efficiently. Thus, where an electrode extends over one major face of the element in a detector embodying the invention, a reduction in the area of that face can reduce both the electrical capacitance and the thermal capacitance; hence a target for a pyroelectric camera tube may comprise an array of such detectors.

The electrode means preferably extend across substantially the whole of said at least one of the faces. A useful signal can thereby be derived from substantially all the pyroelectric material to which thermal energy is supplied from radiation incident on the operative surface region.

Part of the operative surface region may overlap the element of pyroelectric material. Said part of the operative surface region may be coextensive with a major surface of the element. The element may be positioned centrally with respect to the operative surface region. These three features each reduce the average distance through which thermal energy must diffuse to change the temperature of the element.

The thermal diffusion means may, in addition to high thermal diffusivity, have a high thermal conductance and a low thermal capacity. The optimum achievable values for these parameters, and particularly for the second and third which may be opposing requirements, may depend on the size of the detector and on its desired frequency response.

The thermal capacitance of the thermal diffusion means is substantially less than the thermal capacitance of the pyroelectric element. Thermal energy from incident radiation may thus be mainly directed to changing the temperature of the element rather than merely changing the temperature of the thermal diffusion means.

Suitably, in operation thermal energy from radiation incident on said remote parts is dissipated therefrom by thermal conduction mainly or substantially wholly by the thermal diffusion means. This way be achieved by making all paths by which heat can be conducted from the operative surface region of low thermal conductance except the path to the element, and by providing a minimum of thermal capacitance adjacent the operative surface region except the element.

In operation, thermal energy from radiation incident on said remote parts may be supplied to the element by the thermal diffusion means substantially along the operative surface region. The detector preferably comprises a flexible film resiliently supporting the element, and the thermal diffusion means may comprise a thermally conductive layer extending along and supported by the film. The detector may comprise a further layer supported by the film and coextensive with the thermally conductive layer for absorbing incident radiation.

According to a second aspect of the invention, a method of operating a pyroelectric detector as set forth in the opening paragraph, wherein the method comprises introducing a periodic variation with time into the intensity of radiation incident on the operative surface region, is characterised in that the volume of the element of pyroelectric material is substantially less than would be the volume of an element of pyroelectric material which extended over the whole of said region and which had a thickness equal to the smallest spacing between the faces of said at least one pair, and in that thermal energy from radiation incident on parts of said region remote from the element is supplied to the element by thermal conduction in an interval of time substantially less than the period of said periodic variation.

The maximum frequency (or the minimum period) with which the detector can usefully be operated will depend on the maximum distance over which thermal energy must be supplied from the operative surface region to the element, and the thermal diffusivity of the material by which the energy is supplied. Suitably, thermal energy from radiation incident on parts of said region most remote from the element is supplied by thermal conduction over a distance substantially less than the thermal diffusion distance (as herein defined). The thermal diffusion distance is hereby defined as $$\sqrt{(k/\omega)}$$

where k is the thermal diffusivity of the thermal diffusion means and is equal to thermal conductivity divided by volume specific heat, and $\omega$ is the angular frequency of periodic variation and is equal to $2\pi f$ where f is the frequency of periodic variation.

An embodiment of the invention will now be described, by way of example, with reference to the accompanying diagrammatic drawing which is a cross-sectional view of a detector embodying the invention and comprising an element 1 of pyroelectric material between two flexible films 2 and 3 respectively.

In the drawing, the thicknesses of the element, the flexible films, various layers thereon and adhesive therebetween (i.e. their dimensions in a generally vertical direction) have been greatly exaggerated, and consequently the films and layers thereon have had to be drawn with substantial curvature. The actual thicknesses of these integers are so small relative to their horizontal dimensions that the structure is in fact substantially planar.

The element 1 of pyroelectric material has electrodes 4 and 5 covering the whole of its lower and upper major surfaces respectively. Although the element 1 is very thin and consequently fragile, it is far less flexible than the films 2 and 3 and can be self-supporting. In the detector, it is supported by at least one of the films. The films 2 and 3 are held tautly around their peripheries on a substantially rigid ring 6 of electrically insulating material. The lower film 2 supports an electrically conductive layer 7 providing an electrical connection between the lower electrode 4 and a further electrically conductive layer 8 which extends over the ring 6 and the layer 7 at the periphery of the films to form one terminal of the detector.

The upper flexible film 3 supports a plurality of layers; a layer 9 for absorbing incident radiation in the wavelength range of interest, an electrically conductive thermal diffusion layer 10 contiguous and coextensive with the absorbing layer 9, and an electrically conductive layer 11 providing an electrical connection between the upper electrode 5 on the element, in this case via the electrically conductive layer 10, and a further electrically conductive layer 12 which extends over the ring 6 and the layer 11 at the periphery of the films to form a second terminal of the detector. A layer 14 of adhesive between the films pulls the films towards one another, thereby holding the element 1 in position and urging the layers 7 and 10 on films 2 and 3 respectively against the electrodes 4 and 5 on the element 1.

This detector is similar to a detector described in our co-pending European Patent Application No. 81200565.0 (with the particular exception of layers 9, 10 and 11 which replace a single narrow electrically conductive layer connecting the upper electrode on the element to a terminal such as 12 at the periphery of the flexible films), and may be made by a method analogous to that described therein. The ring 6 may have a cross-section 1 mm square and an outer diameter of 6 mm. The flexible films 2 and 3 may be of polyimide plastics material and each have a thickness of about 1 μm, being formed from a solution of PYRE-M.L. (Trade Mark), Du Pont) wire enamel type No. RC 5044 in N-methyl-2-pyrrolidone. The adhesive 14 may be formed from a more dilute solution of the same substances. Layers 4 and 5 on the element 1, layer 7 on film 2 and layers 9, 10 and 11 on film 3 may be provided by vacuum-deposition. The electrodes 4 and 5 may be of a nickel-chromium alloy about 30 nm thick, electrically conductive layers 7 and 11 may be mainly of gold on a thin "seed" layer of nickel-chromium alloy with a total thickness of about 30 nm and a width of about 50 μm, the absorbing layer 9 may be of antimony about 50 nm thick, and the thermal diffusion layer 10 may be of aluminium about 0.5 μm thick. Terminal layers 8 and 12 may be formed from liquid bright gold and have a thickness of a few hundred nm.

The pyroelectric element 1 may for example be of PLMZT (lead lanthanum manganese zirconium titanate), and may have major surfaces each 1 mm square and a thickness perpendicular thereto of about 30 μm. The layers 9 and 10 on the upper flexible film 3 may extend over a square with a side of 2 mm, thereby providing the detector with an operative surface region having an area four times that of a major surface of the element 1. Radiation incident on the layer 9 is absorbed thereby (a small amount may also be absorbed by the film 3) and the thermal energy is supplied by thermal conduction through the layers 9 and 10 to the upper major surface of the element 1. In the central part of the operative surface region coextensive with the element, heat transfer by thermal conduction is in a direction substantially perpendicular to the film 3, while in the outer parts of the region remote from the element, heat transfer by thermal conduction through the layers 9 and 10 (predominantly the latter since it has a much greater thermal conductance) is substantially along the operative surface region, parallel to the film 3.

The thermal conductances of the flexible films and the layers 7 and 11 are low, and consequently the great majority of thermal energy from radiation incident on parts of the operative surface region remote from the element that is dissipated by thermal conduction is transferred by the layers 9 and 10 towards the element, rather than radially outwards towards the ring 6. Furthermore, the thermal capacitance of the layer 10 is much less than, and the thermal capacitances of the layer 9 and of the film 3 in the operative surface region are very much less than, the thermal capacitance of the element 1. Consequently, the majority of the thermal energy of the absorbed radiation contributes to changing the temperature of the element rather than merely changing the temperature of adjacent material.

The thermal diffusivity and the thermal conductance of the layer 10 are high, and consequently thermal energy from radiation incident on parts of the surface region remote from the element can be rapidly supplied to the element. The detector may be required to respond to any sudden change, due to an external cause, in the intensity of the incident radiation, for example the sudden appearance within its field of view of an object with a temperature differing from that of the background, in which case it is desirable that the thermal time-constant of the detector should not be much greater than that of the element itself. Alternatively, a beam of radiation from external sources may be regularly modulated with a chopper which periodically interrupts the beam, so that the detector will respond to any difference in the intensities of the external beam and of the radiation from the chopper. The responsivity and the NEP of the detector will generally worsen with increasing frequency. The better the thermal diffusivity and conductance of the thermal diffusion means, the higher are the modulation frequencies at which these parameters of the detector will have deteriorated to given values. This may be expressed more precisely by the requirement that the maximum distance over which thermal energy must be supplied from the operative surface region to the element should be much less than the thermal diffusion distance, as explained above. On this basis, it is estimated that the above-described detector will operate usefully at frequencies up to about 200 Hz.

In a target for a pyroelectric camera tube comprising an array of detectors each embodying the invention and each comprising an element supported on only one major surface thereof, it may be desirable for electrically conductive material which is comprised in the thermal diffusion means and which would be exposed to the scanning electron beam in the camera tube to be covered with material which is electrically insulating or of low electrical conductivity for example, $SiO_x$ where $1<x<2$ which may be provided by vacuum deposition and which allows excess charge to leak away.

I claim:

1. A pyroelectric detector comprising an element of pyroelectric material having at least one pair of opposed faces for generating electrical charges at the two faces of said one pair when the temperature of the element changes, electrode means extending over at least one of the faces of said one pair for detecting charges generated by the element, the detector having an operative surface region in which variations with time in the intensity of radiation incident on every part of said region cause variations in the generated charges detectable with the electrode means, the volume of the element of pyroelectric material being substantially less than would be the volume of an element of pyroelectric material which extended over the whole of said region and which had a thickness equal to the smallest spacing between the faces of said at least one pair, and thermal diffusion means extending to the element from parts of said region remote therefrom for supplying thermal energy to the element from radiation incident on said remote parts, and wherein the thermal capacitance of the thermal diffusion means is substantially less than the thermal capacitance of the element.

2. A detector as claimed in claim 1 wherein the two faces of said one pair are major surfaces of the element between which is said smallest spacing.

3. A detector as claimed in claim 1 or 2 wherein the electrode means extend over substantially the whole of said at least one of the faces.

4. A detector as claimed in claims 1 or 2 wherein a part of the operative surface region overlaps the element of pyroelectric material.

5. A detector as claimed in claim 4 wherein said part of the operative surface region is coextensive with a major surface of the element.

6. A detector as claimed in claim 4 wherein the element is located centrally with respect to the operative surface region.

7. The detector as claimed in claims 1 or 2 wherein in operation thermal energy from radiation incident on said remote parts is dissipated therefrom by thermal conduction mainly by the thermal diffusion means.

8. A detector as claimed in claim 7 further comprising a flexible film resiliently supporting the element and wherein the thermal diffusion means comprises a thermally conductive layer extending along and supported by the film.

9. A detector as claimed in claim 8 comprising a further layer of material for absorbing incident radiation and supported by the film and coextensive with the thermally conductive layer.

10. A detector as claimed in claims 1 or 2 wherein in operation thermal energy from radiation incident on said remote parts is supplied to the element by the thermal diffusion means substantially along the operating surface region.

11. A detector as claimed in claim 1 further comprising a flexible film resiliently supporting the element and wherein the thermal diffusion means comprises a thermally conductive layer sandwiched between said flexible film and one of said faces of the element, said thermally conductive layer extending along and supported by the film.

12. A detector as claimed in claim 11 further comprising a second flexible film arranged in a sandwich configuration in which the first and second films form the outer layers of the sandwich between which are located the thermally conductive layer and the element.

13. A detector as claimed in claim 12 further comprising a ring made of insulator material to which the outer periphery of the flexible films are secured, and an electrically conductive layer on said ring and extending between said films so as to contact a part of said electrode means.

14. A detector as claimed in claim 1 further comprising a flexible film supporting a layer of material for absorbing incident radiation, and wherein the themal diffusion means comprises a thermally conductive layer extending along and supported by the film and sandwiched between said layer of radiation absorbing material and one of said faces of the element.

15. A detector as claimed in claim 14 further comprising a second flexible film arranged in a sandwich configuration in which the first and second films form the outer layers of the sandwich between which are located, in the order named, the layer of material for absorbing incident radiation, the thermally conductive layer and the element.

16. A method of operating a pyroelectric detector comprising an element of pyroelectric material having at least one pair of opposed faces for generating electrical charges at the two faces of said one pair when the temperature of the element changes, and electrode means extending over at least one of the faces of said one pair for detecting charges generated by the element, the detector having an operative surface region wherein variations with time in the intensity of radiation incident on every part of said region cause variations in the generated charges detectable with the electrode means, wherein the method comprises introducing a periodic variation with time into the intensity of radiation incident on the operative surface region, characterised in that the volume of the element of pyroelectric material is substantially less than would be the volume of an element of pyroelectric material which extended over the whole of said region and which had a thickness equal to the smallest spacing between the faces of said at least one pair, and in that thermal energy from radiation incident on parts of said region remote from the element is supplied to the element by thermal conduction in an interval of time substantially less than the period of said periodic variation.

17. A method as claimed in claim 16 wherein thermal energy from radiation incident on parts of said region most remote from the element is supplied to the element by thermal conduction in a thermal diffusion means and over a distance substantially less than the thermal diffusion distance defined as $(\sqrt{k/2\pi f})$ where f is the frequency of the periodic variation and k is the thermal diffusivity of the thermal diffusion means.

* * * * *